(12) United States Patent
Baca et al.

(10) Patent No.: US 9,082,983 B1
(45) Date of Patent: Jul. 14, 2015

(54) SOLUTION PROCESSABLE THIN-FILM TRANSISTORS

(71) Applicant: The United States of America as represented by the Secretary of the Navy, Washington, DC (US)

(72) Inventors: Alfred G. Baca, Ridgecrest, CA (US); William C. Lai, Ridgecrest, CA (US)

(73) Assignee: The United States of America as Represented by the Secretary of the Navy, Washington, DC (US)

( * ) Notice: Subject to any disclaimer, the term of this patent is extended or adjusted under 35 U.S.C. 154(b) by 25 days.

(21) Appl. No.: 14/023,219

(22) Filed: Sep. 10, 2013

Related U.S. Application Data

(63) Continuation-in-part of application No. 13/971,104, filed on Aug. 20, 2013, and a continuation-in-part of application No. 13/895,885, filed on May 16, 2013, now Pat. No. 8,993,713.

(60) Provisional application No. 61/700,554, filed on Sep. 13, 2012, provisional application No. 61/692,633, filed on Aug. 23, 2012, provisional application No. 61/647,653, filed on May 16, 2012.

(51) Int. Cl.
*H01L 51/00* (2006.01)

(52) U.S. Cl.
CPC ................................. *H01L 51/0043* (2013.01)

(58) Field of Classification Search
CPC .. H01L 51/05; H01L 51/0508; H01L 51/0545
USPC ............ 257/40, 213–413, E51.002–E51.052
See application file for complete search history.

(56) References Cited

U.S. PATENT DOCUMENTS

| 7,671,202 | B2* | 3/2010 | Marks et al. | 546/37 |
|---|---|---|---|---|
| 7,745,821 | B2* | 6/2010 | Zheng et al. | 257/40 |
| 7,829,680 | B1 | 11/2010 | Sander et al. | |
| 8,022,214 | B2* | 9/2011 | Facchetti et al. | 546/37 |
| 8,427,812 | B1 | 4/2013 | Stenger-smith et al. | |
| 8,481,736 | B2* | 7/2013 | Koenemann et al. | 546/26 |
| 2005/0176970 | A1* | 8/2005 | Marks et al. | 549/41 |
| 2006/0011909 | A1* | 1/2006 | Kelley et al. | 257/40 |
| 2009/0134387 | A1* | 5/2009 | Harada | 257/40 |
| 2010/0283041 | A1* | 11/2010 | Nakamura et al. | 257/40 |

OTHER PUBLICATIONS

Shin, et al. Omnidirectional resonance in a metal dielectric metal geometry, Applied Physics Letters, vol. 84, No. 2231, May 2004, pp. 4421-4423.
Schneider, et al. "An Ultraviolet Organic Thin-Film Solid-State Laser for Biomarker Applications", Advanced Materials, vol. 17, No. 1, Jan. 6, 2005, pp. 31-34.
Baier, et al. Fluorescent conjugated polymer nanoparticles by polymerization in miniemulsion, J. Am. Chem. Soc. 2009, vol. 131, pp. 14267-14273.
U.S. Appl. No. 13/895,885, Lai, et al.
U.S. Appl. No. 13/971,104, Lai, et al.
U.S. Appl. No. 14/172,701, Harvey, et al.
U.S. Appl. No. 14/172,673, Harvey, et al.
U.S. Appl. No. 13/667,188, Roberts, et al.
U.S. Appl. No. 13/658,573, Roberts, et al.
U.S. Appl. No. 13/667,205, Roberts, et al.
U.S. Appl. No. 13/667,206, Roberts, et al.

* cited by examiner

*Primary Examiner* — Jesse Y Miyoshi
*Assistant Examiner* — Stephen C Smith
(74) *Attorney, Agent, or Firm* — Charlene A. Haley

(57) ABSTRACT

A thin film transistor having a solution-processed n-type copolymer semiconductor material. A thin-film transistor (TFT) device including, an organic TFT device having at least one substrate, at least one gate electrode, at least one electrically-insulating dielectric material, at least one drain electrode, at least one source electrode, and at least one n-type solution-processable semiconductor material.

10 Claims, 1 Drawing Sheet

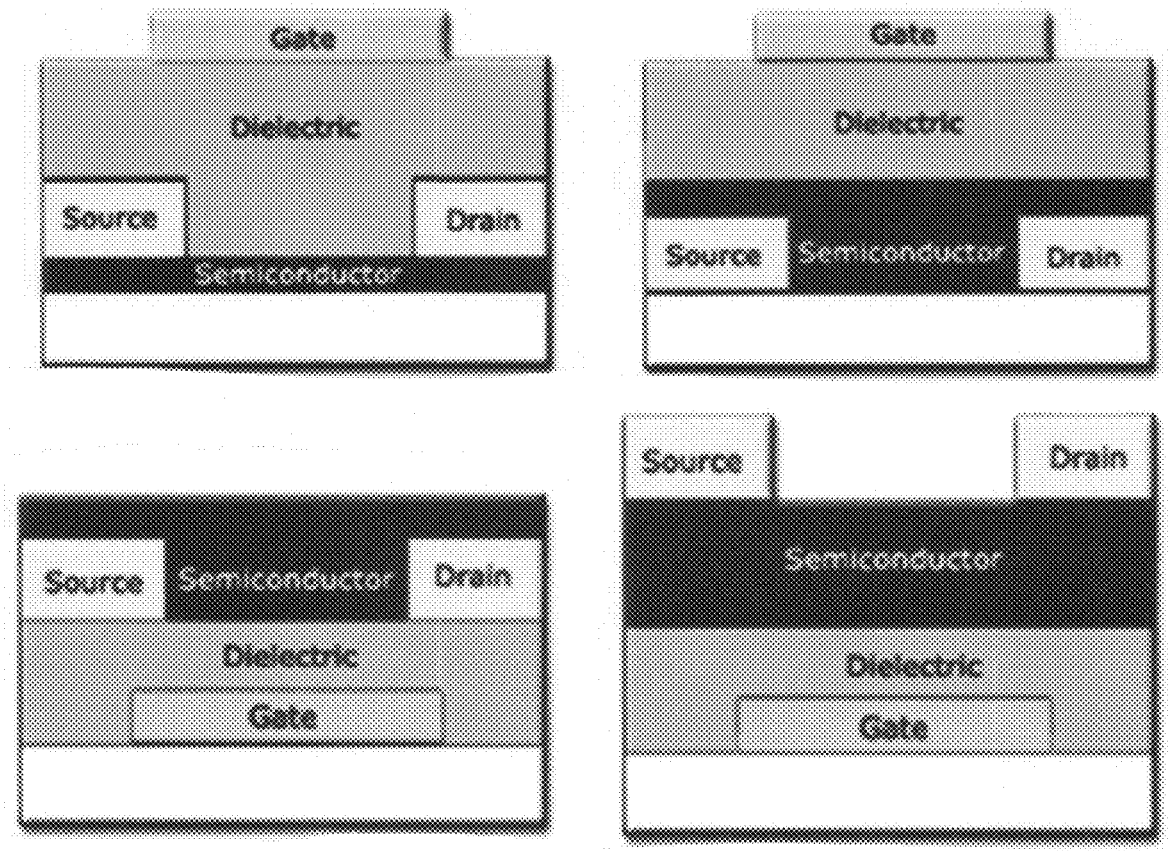
(PRIOR ART)

SOLUTION PROCESSABLE THIN-FILM TRANSISTORS

CROSS-REFERENCE TO RELATED APPLICATIONS

This is a non-provisional patent application, claiming the benefit of, parent application Ser. No. 61/700,554 filed on Sep. 13, 2012, and is a continuation-in-part of parent provisional patent application Ser. No. 61/692,633 filed on Aug. 23, 2012 which is related to non-provisional patent application Ser. No. 13/971,104 filed on Aug. 20, 2013, and is a continuation-in-part of parent provisional patent application Ser. No. 61/647,653 filed on May 16, 2012 which is related to non-provisional patent application Ser. No. 13/895,885 filed on May 16, 2013, whereby the entire disclosure of which is incorporated hereby reference.

STATEMENT REGARDING FEDERALLY SPONSORED RESEARCH OR DEVELOPMENT

The invention described herein may be manufactured and used by or for the government of the United States of America for governmental purposes without the payment of any royalties thereon or therefor.

FIELD OF THE INVENTION

Embodiments of the invention generally relate to organic thin film transistors having solution-processed n-type copolymers as the semiconductor material.

BRIEF DESCRIPTION OF THE DRAWING

FIG. 1 are four cross-sectional views of geometries that are used in the fabrication of TFTs; from left to right: the Top-Gate/Top-Contact (TG/TC) geometry; the Top-Gate/Bottom-Contact (TG/BC) geometry; the Bottom-Gate/Bottom-Contact (BG/BC) geometry, and the Bottom-Gate/Top-Contact (BG/TC) geometry where the lower white layer is the substrate, according to embodiments of the invention.

It is to be understood that the foregoing general description and the following detailed description are exemplary and explanatory only and are not to be viewed as being restrictive of the invention, as claimed. Further advantages of this invention will be apparent after a review of the following detailed description of the disclosed embodiments, which are illustrated schematically in the accompanying drawings and in the appended claims.

DETAILED DESCRIPTION OF THE EMBODIMENTS OF THE INVENTION

Embodiments of the invention generally relate to organic thin film transistors having solution-processed n-type copolymers as the semiconductor material.

Organic polymers that have π-electron conjugated backbones are useful in electronic and photonic devices because their π-electrons and holes are relatively mobile and that is why they are called organic semiconductors. These polymers can also be 'doped' with a redox additive or electrodes that donate or withdraw electric charge to or from the polymer which can further enhance charge mobility/density and also fine-tune the optical or electrical bandgap and the stability of the polymer. An auxiliary group attached to the conjugated polymer backbone can also donate or withdraw electric charge to or from the conjugated backbone of the polymer, which imparts similar changes in charge mobility, bandgap and stability. In this case an electron-withdrawing group would make the polymer an 'n-type' polymer and an electron donating group would make the polymer a 'p-type' polymer.

n-Type organic materials generally have electron-withdrawing groups/components, such as carbonyl and sp2 nitrogen, such as azo and aromatic pyridine units. p-Type organic material generally have electron-donating groups/components, such as alkoxy, amine, thiophene units. An organic material that is an electronic or photonic 'heterjunction' material is a blend/mixture of an n-type material and a p-type material. Heterojunction polymers are useful in devices such as photovoltaic devices; organic solar cells; field-effect transistors, plastic solar cells; RFID tags; and electronic sensors.

The difference in energy between the highest occupied molecular orbital (HOMO) and the lowest unoccupied molecular orbital (LUMO) of a ladder copolymer (or any polymer having a π-electron-conjugated backbone) is called the electronic bandgap of the material. The stability of n-type materials can be improved either by lowering the energy of lowest unoccupied molecular orbital (LUMO), raising the energy of highest occupied molecular orbital (HOMO) or a combination the two. A method to lower the energy level of LUMO with respect to the energy level of the HOMO is to introduce electron withdrawing elements. In U.S. Pat. No. 8,427,812 the use of a pyridine-based tetraamine instead of a benzene-based tetraamine as comonomer in a BBL-type ladder polymer has been shown to lower the energy of the LUMO by about 0.5 eV. U.S. Pat. No. 8,427,812 describes the stability improvements when using thin film BBL ladder polymers based on tetraamino pyridine as the cathode material at a working voltages of >2.0 volts.

The term 'ladder' polymer generally refers to polymers that have a two-dimensional ribbon-like backbone comprised of covalent bonds running the full length of the backbone, like the sides of a ladder, the rungs of the ladder being part of the fused rings. The limited conformational freedom of π-electron conjugated ladder polymers is responsible for the high electron delocalization and high electron mobility in n-type polymers such as Poly[7-oxo-7H-benz(d,e)imidazo(4',5':5,6)-benzimidazo(2,1-a)isoquinoline-3,4:10,11-tetrayl)-10 carbonyl (BBL), in contrast to conventional conjugated polymers in which have only a one-dimensional backbone of covalent bonds. BBL would have useful electronic, photonic and optoelectronic properties; however, BBL can only be processed in strong Bronsted acids, such as methanesulfonic acid or strong Lewis acids such as gallium trichloride.

Aromatic heterocyclic ladder polymers are also attractive for high temperature applications, however, their limited solubility makes their fabrication very difficult. Furthermore, strong acidic solvents are very corrosive to any substrate touching the polymer. A BBL coating on metals would be impossible due to the corrosive nature of the acidic solvents. This would preclude the use of BBL-type ladder polymers in many types of useful devices, such as photovoltaic devices.

It is to be understood that the foregoing is exemplary and explanatory only and are not to be viewed as being restrictive of the invention, as claimed. Further advantages of this invention will be apparent after a review of the following detailed description of the disclosed embodiments, which are illustrated schematically in the accompanying drawings and in the appended claims.

Embodiments of the invention generally relate to a soluble n-type ladder copolymer and its use in heterojunction materials, heterojunction devices, and other electronic and photonic devices.

Although embodiments of the invention are described in considerable detail, including references to certain versions thereof, other versions are possible. Therefore, the spirit and scope of the appended claims should not be limited to the description of versions included herein.

Embodiments of the invention include a new class of ladder polymers formed with tetracarbonyl perylene having solubilizing substituents and tetraamino pyridine as the repeat unit. The tetracarbonyl perylene (which is the first unit in the ladder-polymer backbone) is functionalized with solubilizing groups on the 1, 6, 7, and/or 12 positions of the aromatic perylene molecular framework. 2,3,5,6-Tetraamino pyridine is the second unit in the ladder-polymer backbone. The pyridine unit enhances the n-type nature of the polymer, which lowers its electronic bandgap; this is desirable because lowering the bandgap also increases its electro-chemical stability and increases its thermal stability in air. The general structure of the ladder polymers of the invention is shown in Scheme 1. The 'n' is the number of perylene-pyridine repeat units in the polymer backbone, and $R_5$, $R_6$, $R_7$, and $R_8$ can be aryl, alkyl aryl, alkoxy aryl, and aryloxy aryl.

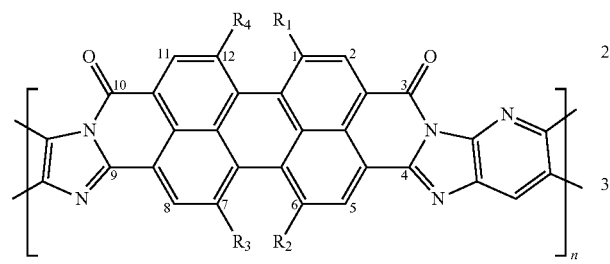

Scheme 1. General structure of the perylene-pyridine ladder polymer embodiment having solubilizing groups at position(s) 1, 6, 7, and/or 12.

End groups, as an embodiment of the invention, may be placed on the polymer to further enhance solubility and stability. The precursors to the end groups (essentially monofunctional monomers) are added with the repeating monomers to the polymerization vessel and become attached at the chain ends. These mono-functional end-capping compounds are also used to control the molecular weight of the copolymer. They normally are added to the polymerization vessel at $\frac{1}{10}^{th}$ to $\frac{1}{100}^{th}$ part per part of the other difunctional monomers (moles per mole). Examples of such end-capping groups (precursors to the copolymer end groups) are shown in Scheme 2. The solubilizing groups on the end groups are chosen from the same solubilizing groups that are attached to the perylene units, namely, aryl, alkyl aryl, alkoxy aryl, and aryloxy aryl.

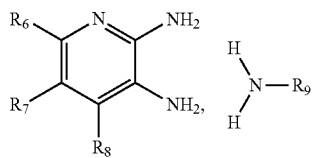

Scheme 2. Examples end-capping compounds (precursors to the copolymer end groups), where $R_5$, $R_6$, $R_7$, and $R_8$ can be aryl, alkyl aryl, alkoxy aryl, and aryloxy aryl.

A heterojunction material having the soluble n-type ladder copolymer(s) is also an embodiment of the invention. The heterojunction material also has a soluble p-type organic material, including polythiophene, poly(3-alkylothiphene), poly(3-arylthiophene), poly(3,4-alkoxythiophene), poly (phenylene-co-vinylene), poly(methylethylhexylphenylene-co-vinylene), other substituted poly(phenylene-co-vinylene) s, and other p-type organic polymers. The normal ratio of the n-type and the p-type components of the heterjunction material is one part by weight of the p-type material and one-quarter to two parts by weight of the soluble n-type ladder copolymer.

A photonic and/or electronic device includes the heterojunction material having the soluble n-type ladder copolymer component, including a heterjunction photovoltaic cell, is an embodiment of the invention. The heterjunction material in the device may, for example, be a film or an array of quantum dots, and will have one dimension in the range of about 10 to about 1000 nanometers. The surface of the heterjunction material may be embossed and/or nano-imprinted with nano-features, including pillars and/or wells. An example of a typical fabrication method is given below.

The preparation of the monomers that are used in the condensation polymerization to form the repeat units in the copolymer of the invention are described in Examples 1-10.

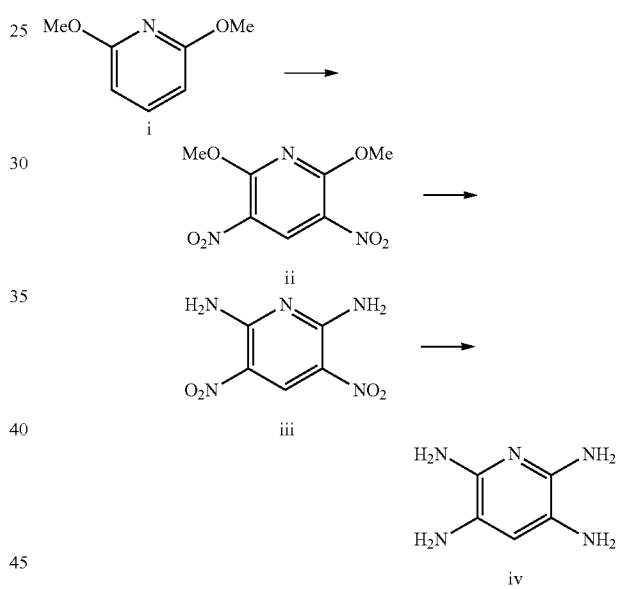

Scheme 3. Preparation of 2,3,5,6-tetraamino pyridine.

Example 1

Preparation of 2,6-dimethoxy 3,5-dinitro pyrazine (Scheme 3, Compound ii). 2,6-Dimethoxy pyrazine (40.0 g, 0.29 mol) was slowly added to a 0° C. solution of fuming nitric and fuming sulfuric acid (160 mL:240 mL). The reaction was allowed to stir for 30 minutes at 0° C. and then allowed to warm to room temperature and stirred for an additional 3 hours. The reaction mixture was poured onto ice (1000 cc) and stirred for 30 minutes. The pale yellow precipitation (33.4 g, 50.8%) was collected, washed with water, air dried and used in next step without further purification.

Example 2

Preparation of 2,6-diamino 3,5-dinitro pyrazine (Scheme 3, Compound iii). Ammonium hydroxide (28%, 60 mL) was added drop wise to a slurry of 2,6-dimethoxy 3,5-dinitro pyrazine (10.0 g, 43.5 mmol) in acetonitrile (50 mL). Upon addition, the yellow slurry became red/yellow in color and eventually became a red solution. As the solution was heated at 65° C. for an hour, yellow precipitate (8.0 g, 92.2%) began to form, which was filtered hot and allowed to air dry.

Example 3

Preparation of 2,3,5,6-tetraamino pyrazine (Scheme 3, Compound iv). 2,6-Diamino 3,5-dinitro pyrazine (15.0 g, 75 mmol), 5% palladium on carbon (2.0 g) and deoxygenated water (200 mL) was added to a parr shaker and charged with 50 psi of hydrogen and allowed to shake at room temperature for 24 hours. The reaction mixture was added to deoxygenated boiling water (750 mL) and filtered hot. The filtrate was allowed to cool to room temperature and the resulting solid was recrystallized from concentrated HCl (16.1 g, 80.1%). Crystal exists as a trihydrogen chloride mono hydrate system.

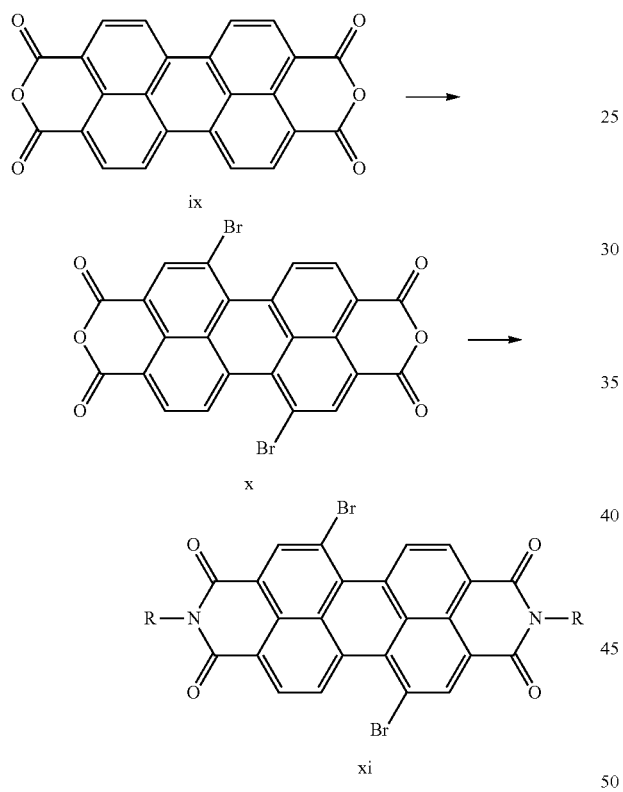

Scheme 4. Preparation of 2,7-dibromoperylene-3,4,9,10-tetracarboxylic acid dianhydride (x) and diimide (xi).

Example 4

Preparation of 2,7-dibromoperylene-perylene 3,4,9,10-tetracarboxylic acid dianhydride (Scheme 4, Compound x). Compound ix (100 g, 254.9 mmol) was added to sulfuric acid (800 mL) and allowed to stir at 60° C. for 2 days. Iodine (3 g, 11.8 mol) was added and stirred for 5 hours and then bromine (200 g, 1.25 mol) was added dropwise. The heat was increased to 80 C and the reaction was heated for another 2 days. The reaction mixture was allowed to cool to room temperature and poured into ice water (1 L). The red precipitate was collected, dried and used in the next step without further purification.

Example 5

Preparation of N,N'-Di(2-ethylhexyl)-1,7-dibromoperylene-3,4,9,10-tetracarboxylic acid diimide (Scheme 4, Compound xi). A flask was charged with 2,7-dibromoperylene-3,4,9,10-tetracarboxylic acid dianhydride (6.13 g, 11.1 mmol) (Compound x), 2-ethylhexylamine (4.5 mL, 30 mmol), 1-methyl-2-pyrrolidinone (50 mL) and acetic acid (3.5 mL). The suspension was heated at 100° C. for 2 days then poured into 1 M HCl (200 mL). The red precipitate was isolated by filtration then washed with water and methanol. The product was purified by column chromatography on silica gel (eluent: 70-80% dichloromethane in hexanes). The red solid was then dissolved in 50 mL of toluene. This solution was exposed to the vapor of hexanes over 14 days, resulting in the crystallization of the product as a red powder.

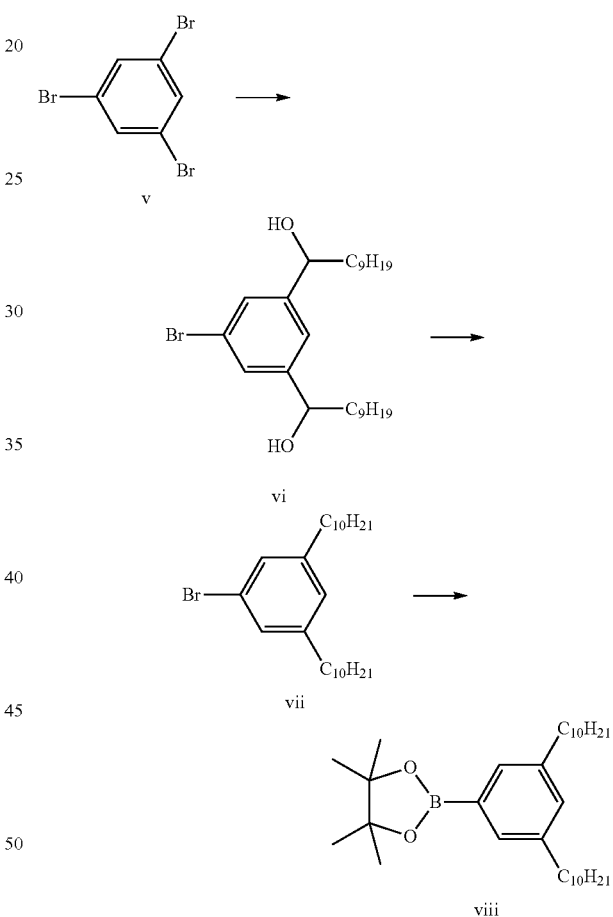

Scheme 5. Preparation of a solubilizing group to be attached to the perylene units.

Example 6

Preparation of 1-bromo-3,5-di(1-hydroxydecyl)benzene (Compounds vi in Scheme 5). A flask containing 1,3,5-tribromobenzene (4.61 g, 14.6 mmol), Compound v and diethyl ether (150 mL) was cooled to −78° C. To this was added a solution of tert-butyllithium in pentane (35.2 mL, 1.7 M) dropwise by syringe over 15 min. The solution changed from clear to orange. After stirring at −78° C. for 30 min, 1-decanal (6.03 mL, 32.1 mmol) was added dropwise by syringe over 10 min. After warming to room temperature, dilute aqueous ammonium chloride (150 mL) was added. The layers were separated, and the aqueous layer was extracted with diethyl ether (100 mL) and ethyl acetate (100 mL). The combined organics were washed with brine (100 mL) and dried over sodium sulfate. The solvent was removed at reduced pressure yielding a white solid. This product was purified by column chromatography on silica gel (eluent: 15-25% ethyl acetate in hexanes) yielding 5.1 g of white solid (Compound vi in 74% yield).

Example 7

Preparation of 1-bromo-3,5-didecylbenzene, Compound vii, Scheme 5. A flask was charged with Compound vi (1.50 g, 3.19 mmol), triethylsilane (3.6 mL, 22 mmol), and dichloromethane (14 mL). The solution was cooled to 0° C., then boron trifluoride diethyl etherate (2.8 mL, 22 mmol) was added dropwise by syringe. The solution was allowed to slowly warm to room temperature while stirring for 1 day. Potassium bicarbonate (1 M) was then added with vigorous stirring until the solution turned basic. This solution was extracted with dichloromethane (2×200 mL). The organics were dried with sodium sulfate then concentrated and dried to yield 1.28 g of light orange oil (92% yield).

Example 8

Preparation of pinacol boronate (Compound viii, Scheme 5). A flask containing vii (1.07 g, 2.45 mmol) and THF (15 mL) was cooled to −78° C. To this solution was added tert-butyllithium in pentane (3.2 mL, 1.7 M) dropwise by syringe over 10 min. After stirring for 20 min at −78° C., 2-isopropoxy-4,4,5,5-tetramethyl-1,2,3-dioxaborane (0.65 mL, 3.2 mmol) was added by syringe over 3 min. After stirring for 25 min, the solution was warmed to room temperature and quenched by addition of dilute aqueous ammonium chloride (50 mL). This solution was extracted with ethyl acetate (3×60 mL). The organics were dried over sodium sulfate and concentrated under reduced pressure. Drying under vacuum yielded 1.20 g of clear oil (100% yield).

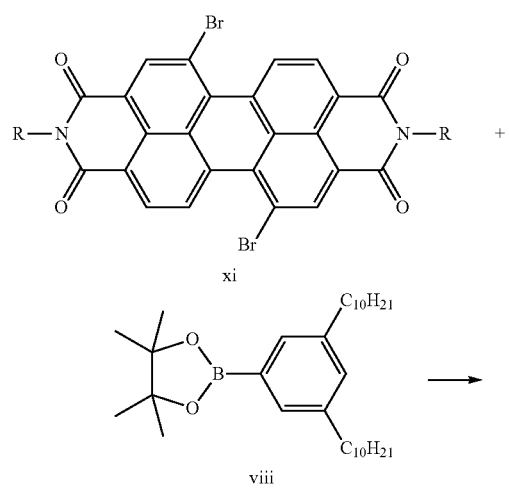

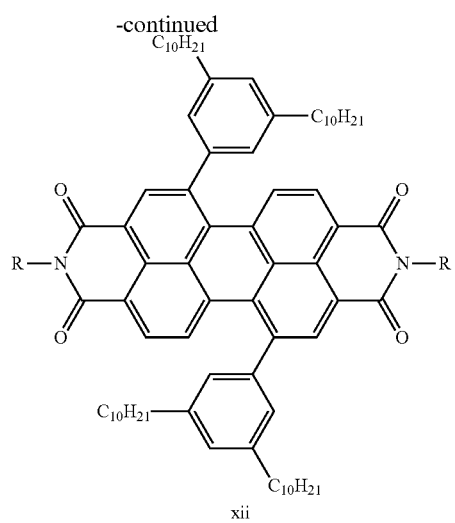

Scheme 6. Coupling of solubilizing groups to perylene core to form the perylene diimide (PDI) precursor to the dianydride monomer.

Example 9

Preparation of solubilized perylene diimide (PDI) (Scheme 6, Compound xii). PDI-Br$_2$ (Compound xi) (1.0 g, 1.29 mmol), dialkyl benzo dioxoborane (1.39 g, 2.85 mmol) (Compound viii), Pd(PPh$_3$)$_4$ (0.15 g, 0.13 mmol) and 2 M K$_2$CO$_3$ aqueous solution (5 mL) in THF (30 mL) was refluxed for 24 hours. After cooling the solution, water (20 mL) and brine was added. The organic layer was separated and dried over MgSO$_4$. The solvent was removed under reduced pressure and the desired product (0.37 g, 21.6%) was obtained by column chromatography (35% dichloromethane in hexanes).

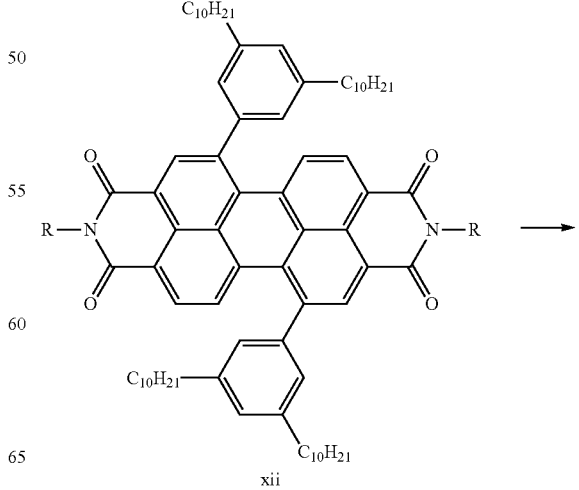

-continued

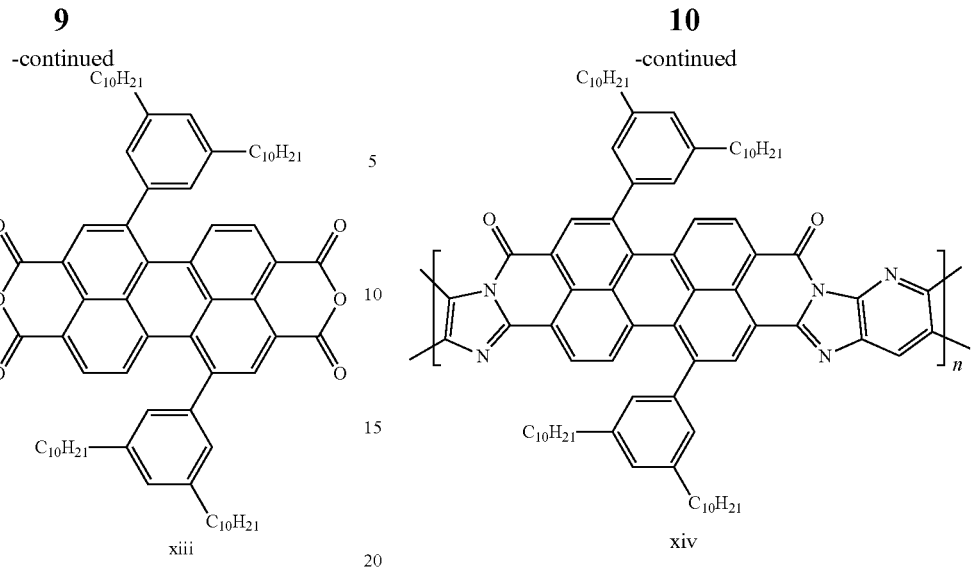

xiii

Scheme 7. Synthesis of the soluble perylene dianhydride monomer from the diimide.

Example 10

Preparation of soluble perylene dianhydride (Scheme 7, Compound xii). A flask was charged with Compound xiii (1.0 g, 0.75 mmol), potassium hydroxide (4.5 g, 80 mmol), and isopropanol (25 mL). The reaction was refluxed for 2 hours, then poured into 0.3 M acetic acid (500 mL) and extracted with hexanes (3×75 mL). The combined organic fractions were dried over sodium sulfate and solvent was removed under reduced pressure. The product was purified by column chromatography on silica gel (eluent: 5-10% ethyl acetate and 0.5% acetic acid in hexanes) yielding 423 mg of dark purple solid (50.7% yield).

These are prophetic examples:

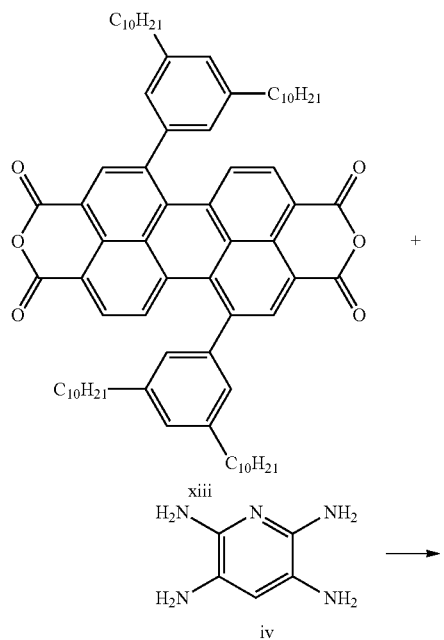

Scheme 8. Condensation of the tetraamine and perylene monomers forming the novel perylene polymer.

Example 11

Preparation of perylene tetra amino pyridine polymer (Scheme 8, Copolymer xiv). Tetraamino pyridine (Scheme 1, Compound iv) is added to polyphosphoric acid under a nitrogen blanket. The mixture is heated to 120° C. and vacuum is applied to the reaction. When the reaction ceases to bubble, the soluble PDI monomer (Scheme 8, Compound xiii) is added and the reaction is allowed to stir for 1 day. The temperature is raised to 180° C. and allowed to stir for another 2 days. The temperature is then raised to 225° C. and stirred for 4 hours. The reaction is allowed to cool to 100° C. and poured into water. The precipitate is collected, washed with methanol and dried.

Example 12

Fabrication of a heterojunction material and a heterojunction photovoltaic cell (device). Organic PV devices are composed of substrate, a blend (1:1 is usually an optimal concentration) of organic acceptor and donor semiconducting materials, cathode and anode metal contacts. The device is formed on a substrate which can be composed of silicon, Ge, Quartz wafers, glass, plastic materials including polyethylene, and or elastomeric substrate including polydimethylsiloxanes. A cathode electrode is deposited on the substrate. The cathode material is composed of highly conductive metals, including Au, Ag, and Al, and/or metal oxides including ITO, ZnO, and ZITO. A blend of electron acceptor materials including polythiophene, MEH-PPV and other p-type organic polymers and solution processable ladder copolymer(s) of the invention (e.g., Copolymer xiv of Scheme 8). Deposition of a thin, electrically conductive film, a metal or metal alloy including Ag, Au, and Al, Pt, and/or metal oxide including ITO, ZnO, and ZITO completes the device fabrication. For the nano-imprint and/or nano-embossing embodiment, the blended layer (the heterojunction having electron acceptor and donor materials) is imprinted with nanoscale features prior to the deposition of the top metal layer.

Embodiments of the invention generally relate to n-type ladder copolymers including, a n-type ladder copolymer formed with alternating perylene and pyridine units having chemical structure A having two end groups,

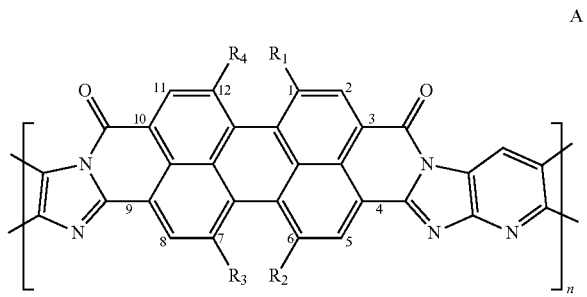

A where the perylene units having at least one solubilizing group attaching at position(s) 1, 6, 7, and/or 12, where the $R_1$, $R_2$, $R_3$, and $R_4$ solubilizing group(s) are each independently selected from the group consisting of aryl, alkyl aryl, alkoxy aryl, and aryloxy aryl, and where n repeat units ranging from about 4 to about 400. Another aspect of the invention generally relates to organic heterojunction layer including, an organic heterojunction blend having at least one solution-processable p-type organic material and at least one solution-processable n-type ladder copolymer, where the copolymer formed with alternating perylene and pyridine units and having chemical structure D,

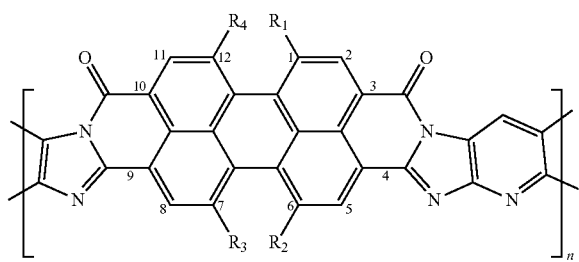

D where the perylene units having at least one solubilizing group attaching at position(s) 1, 6, 7, and/or 12, where at least one of the $R_1$, $R_2$, $R_3$, and $R_4$ solubilizing group(s) are each independently selected from the group consisting of aryl, alkyl aryl, alkoxy aryl, and aryloxy aryl, and where n repeat units ranging from about 4 to about 400.

Yet another aspect of the invention generally relates to liquid pre-cursor solutions including, at least one solvent and n-type ladder copolymer(s), where the copolymer formed with alternating perylene and pyridine units having chemical structure E,

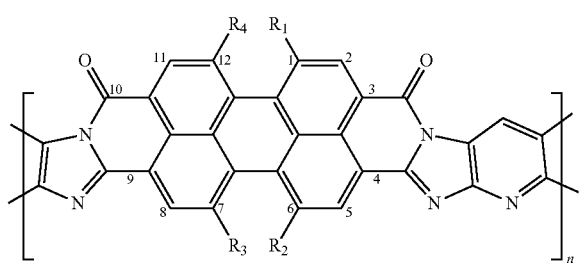

E where the perylene units having at least one solubilizing group attaching at position(s) 1, 6, 7, and/or 12, where the $R_1$, $R_2$, $R_3$, and $R_4$ solubilizing group(s) are each independently selected from the group consisting of aryl, alkyl aryl, alkoxy aryl, and aryloxy aryl, where n repeat units ranging from about 4 to about 400, and where the solvent(s) selected from the group consisting of toluene, xylene, other aromatic hydrocarbons, anisole, veritrol, other aryl ethers, dimethylfomamide, n-methyl pyrrolidinone, dimethylacetamide, chlorobenzene, dichlorobenzene, other halogenated aromatic hydrocarbons halogenated aliphatic hydrocarbons, and other common organic solvents.

Still yet in other aspects the invention generally relates to methods of forming an organic heterojunction film including, providing a liquid solution having at least one solvent, at least one p-type organic material, and at least one n-type ladder copolymer, where the copolymer is formed with alternating perylene and pyridine units having chemical structure F,

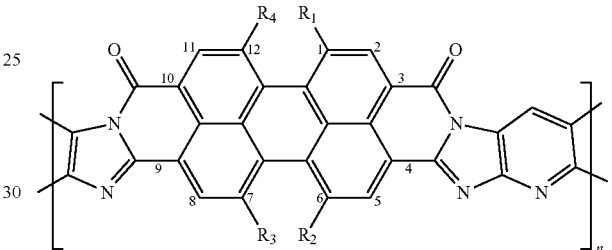

F where the perylene units having at least one solubilizing group attaching at position(s) 1, 6, 7, and/or 12, where the $R_1$, $R_2$, $R_3$, and $R_4$ solubilizing group(s) are each independently selected from the group consisting of aryl, alkyl aryl, alkoxy aryl, and aryloxy aryl, where n repeat units ranging from 4 to 400, casting the solution on a suitable substrate providing at least one solvent-swollen film, and removing the residual solvent from the solvent-swollen film with vacuum and/or heat producing at least one the heterojunction film.

Embodiments of the invention further include fabricating a photovoltaic device by providing a suitable substrate selected from the group consisting of silicon, germanium, quartz, glass, polyethylene, polyethylene terephthalate, polydimethylsiloxane, other plastic materials, and other elastomeric materials, depositing on the substrate a first electrode selected from the group consisting of gold, silver, aluminum, other conductive metals, indium-tin-oxide, and other conductive metal oxides materials, depositing on the first electrode a liquid solution, casting the solution producing at least one solvent-swollen film, removing the residual solvent from the solvent-swollen film with vacuum and/or heat producing organic heterojunction film, nano-imprinting and/or embossing pillars and/or wells on and/or in the heterojunction film, and depositing on the imprinted and/or embossed heterojunction film second electrode selected from the group consisting of gold, silver, aluminum, other conductive metals, indium-tin-oxide, and other conductive metal oxides materials producing the photovoltaic device.

Embodiments of the invention include the end groups of base formula B and/or C,

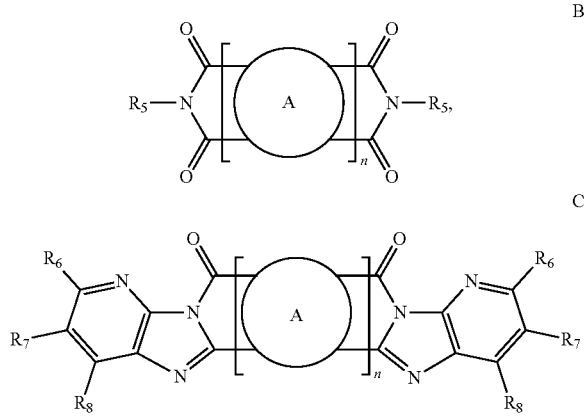

where $R_5$, $R_6$, $R_7$, and $R_8$ are each independently selected from the group consisting of aryl, alkyl aryl, alkoxy aryl, and aryloxy aryl. In other embodiments, the end groups of base formula H and/or I,

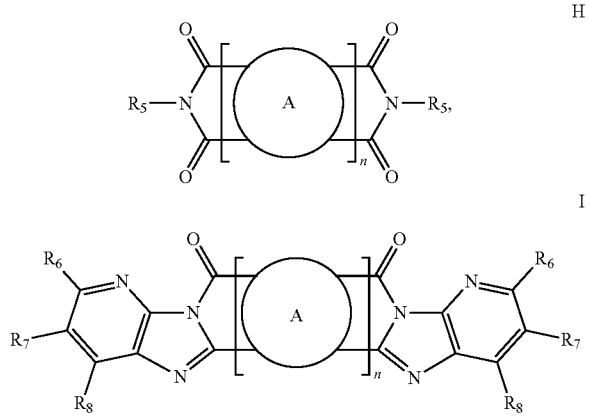

where $R_5$, $R_6$, $R_7$, and $R_8$ are each independently selected from the group consisting of aryl, alkyl aryl, alkoxy aryl, and aryloxy aryl.

In embodiments, the p-type material selected from the group consisting of polythiophene, poly(3-alkylothiphene), poly(3-arylthiophene), poly(3,4-alkoxythiophene), poly(phenylene-co-vinylene), poly(methylethylhexylphenylene-co-vinylene), other substituted poly(phenylene-co-vinylene)s, and other p-type organic polymers. In other embodiments, the composition includes one part by weight the material and one-quarter to two parts by weight the copolymer. In other embodiments, the composition has at least one dimension in the range of about 10 to about 1000 nanometers. In embodiments, the layer having surface embossed and/or nano-imprinted pillars and/or wells.

Another aspect of the invention generally relates to photonic, electronic, photovoltaic, energy detecting, energy harvesting, or solar energy collecting device(s) having the copolymer and/or composition described herein.

Organic polymers that have π-electron conjugated dyes, groups, units, and backbone segments (including the perylene unit) are useful in electronic and photonic devices because their π-electrons (and holes) are relatively mobile (as in semiconductors), and they are often luminescent. These polymers can be 'doped' with a redox additive or by electrodes that donate or withdraw electric charge to and/or from the polymer which can increase charge mobility, fine-tune the optical or electrical bandgap, and increase the stability of the copolymer.

An auxiliary group attached to the π-conjugated units in the copolymer can donate or withdraw electric charge to and/or from the copolymer. Auxiliary groups may also impart changes in charge mobility, size of the bandgap and stability. An electron-withdrawing group on a conjugated backbone segment, dye, or unit would make the copolymer an 'n-type' copolymer, whereas an electron donating group would make the copolymer a 'p-type' copolymer.

Aromatic polymers and copolymers having the perylene unit, here-to-fore, have been shown to have limited solubility in safe and common solvents, and therefore they are very difficult and expensive to fabricate into films. Furthermore, strong exotic solvents can be very corrosive to any substrate touching the copolymer. Moreover, here-to-fore, films made from perylene-containing copolymer systems have rough surfaces and exhibit surface peaks and valleys more than several nanometers in height and depth precluding their use in many applications, such as plasmonic devices.

An embodiment of the invention is a family of n-type soluble perylene copolymers resulting, for example, from the nucleophilic aromatic substitution reaction between a dibromoperylene diimide and a difunctional nucleophile. These copolymers possess the desirable properties of perylene, including photo stability and thermal stability, while at the same time are processable using common organic solvents such as tetrahydrofuran (THF) and chloroform. Furthermore, these copolymers form extremely flat films having surface peak-to-valley roughness less than one nanometer over a surface area of 0.5×0.5 microns, for example, when spin-cast on a conventional glass microscope slide. In this case, the copolymer could also be considered a planarizing film.

Having flexibility in the choice of processing solvents is sometimes advantageous. For example, certain processing techniques used to form bulk hetero-junctions, work well when co-casting the donor and acceptor copolymers/materials using a common solvent. This would be especially true when pairing the perylene copolymer with a specific complementary p-type polymer (or copolymer).

A general chemical structure of soluble n-type perylene copolymers of the invention is shown in (base formula A2).

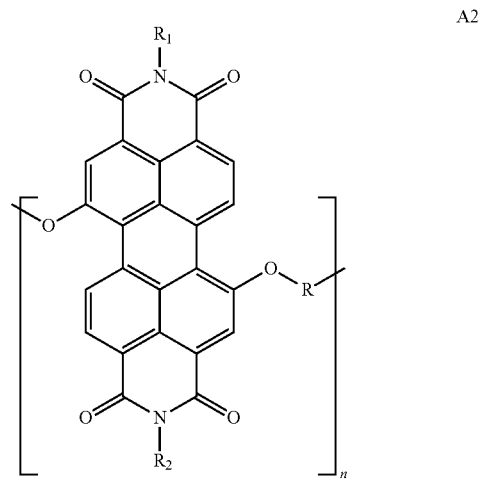

In base formula A2, R is a backbone segment, such as alkylene, arylene and other organic units, as well as hybrid organic-inorganic and organometallic units. Copolymers of the embodiments, of the invention may result from nucleophilic aromatic substitution reactions between, for example, dibromoperylene dialkyl diimide and difunctional nucleophiles. Examples of difunctional nucleophiles are dihydroxyl comonomers (namely, HO—R—OH). Examples of copolymers in which dihydroxyl comonomers are bisphenols are given below. The subscript 'n' signifies the number of repeat units along the copolymer backbone, and may range from about 5 to over 50,000 and may range from 2 to 5 units (called oligomers) to as many as 50,000 units (called high polymers) depending on their use. Also any combination number ranges within 2-50,000 are possible embodiments.

Examples of $R_1$ and $R_2$ (base formula A2) are alkyl, 2-ethylhexyl, 4-carbon to 24-carbon alkyl, 6-carbon to 30-carbon, cycloalkyl, functionalized alkyl, aryl, functionalized aryl, fluorinated groups, and perfluorinated groups.

A general structure of bisphenol comonomers embodied in the invention is shown below. Although a para-substituted structure is shown below, it is to be understood that the substitution patterns on each ring can also independently be ortho and meta.

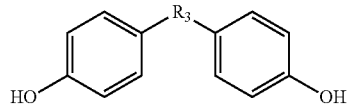

Above is a chemical structure of bisphenol comonomers of the embodiments in the invention. $R_3$ can be, for example, methylene, ethylene, propylene, isopropylene, trimethylcyclohexylene, hexafluoroisopropylene, ether, amine, carbazole, sulfide, sulfone, phosphine, phosphine oxide, and phosphinate. The use of other bisphenol comonomers, including 4,4'-dihydroxy biphenylene and similar dihydroxy triphenylenes, is an embodiment of the invention.

To make the soluble perylene copolymers, the use of bio-derived bisphenol comonomers, shown below, which have flexible solubilizing groups that aide in solubilizing the resulting perylene copolymers and that aide in forming planarizing films of these copolymers, are embodiments of the invention. The use of other commercially available bio-derived bisphenols are embodiments of the invention.

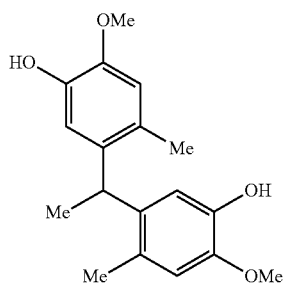

C1

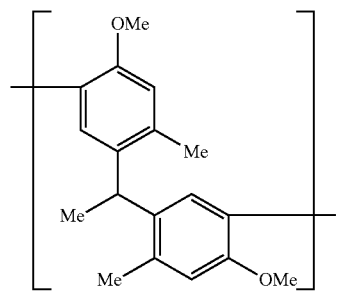

C2

Left side is a bio-derived bisphenol (structure C1); right side is a structure C2, which is an example of an R segment in base formula A2 resulting from the condensation copolymerization of the bisphenol comonomer on the left side with a perylene comonomer.

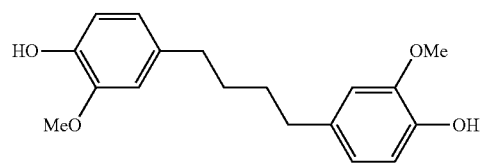

D1

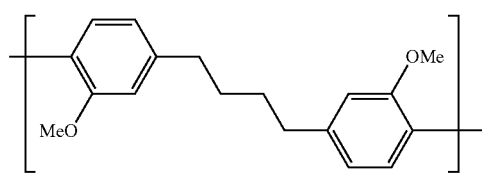

D2

Left side is a second example of a bio-derived bisphenol (structure D1); right side is structure D2, which is an example of an R segment in base formula A2 resulting from the condensation copolymerization of the bisphenol comonomer on the left side.

An example of a perylene comonomer to be incorporated in the copolymers of the invention, for example, by a nucleophilic aromatic substitution reaction, is shown below, where $R_1$ and $R_2$ are, for example, a 2-ethylhexyl alkyl group.

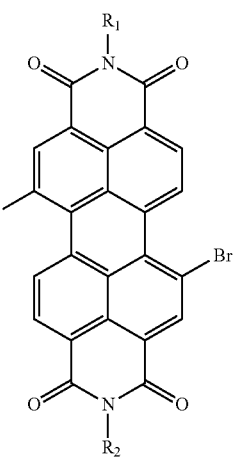

Above is an example of a dibromoperylene comonomer used to make the copolymers of embodiments of the invention. It is to be understood that the foregoing is exemplary and explanatory only and are not to be viewed as being restrictive of the invention, as claimed. Further advantages of this invention will be apparent after a review of the following detailed description of the disclosed embodiments, which are illustrated schematically in the accompanying drawings and in the appended claims.

Example 13

General experimental raw materials and analytical methods for preparing bisphenol comonomers. 2-Methoxy-4-methylphenol (Compound 1), acetaldehyde, propionaldehyde, formaldehyde (37%), $Zn(Ac)_2.2H_2O$, and concentrated HBr (48%) were purchased from Aldrich and used as received. Concentrated HCl and $H_2SO_4$ were purchased from Fisher Scientific and used as received. All NMR data were collected on a Bruker Avance II 300 MHz NMR. NMR samples of bisphenols were prepared in DMSO-$d_6$ and spectra were referenced to the solvent peak (2.50 and 39.5 ppm for $^1H$ and $^{13}C$ NMR, respectively). Products were further analyzed with an Agilent 6890-GC system with a Restek RTX-5MS 30-meter column. The GC inlet temperature was 250° C. and the column oven temperature program began at 40° C. for three minutes and increased to 350° C. at 10° C./min. An Agilent mass selective detector (MSD) 5973 system was used to identify the sample. All elemental analyses were carried out by Atlantic Microlabs Inc. Norcross, Ga.

Example 14

Method for the preparation and analysis of 5,5'-(ethane-1,1-diyl)bis(2-methoxy-4-methylphenol) (Compound C1). Acetaldehyde, 1.06 g (24.1 mmol), and Compound 1, 5.1 g (37.0 mmol), were diluted in 40 mL of $H_2O$. Conc. HCl (10 mL) was slowly added and then reaction was refluxed under $N_2$ for 4 hours. The supernatant was carefully decanted from the resulting dense oil. 3.74 g of white solid was obtained through extraction with ether and precipitation with heptane (68% yield of Compound C1). Crystals suitable for an X-ray diffraction study were obtained from slow evaporation of ether at room temperature. $^1H$ NMR ($d_6$-DMSO) δ: 1.30 (d, 3H, J=7 Hz), 2.06 (s, 6H), 3.69 (s, 6H), 4.05 (t, 1H, J=7 Hz), 6.48 (s, 2H), 6.66 (s, 2H), 8.57 (s, 2H). $^{13}C$ NMR ($d_6$-DMSO) δ: 18.5, 21.3, 36.1, 56.0, 114.6, 115.0, 125.7, 137.0, 144.6, 145.5. MP: 143-146° C., MS m/z: 303, 287, 269, 240, 211, 195, 164, 145, 128, 105. EA Calcd. (found): C, 71.50 (71.58); H, 7.33 (7.46). Further analysis of 5,5'-(ethane-1,1-diyl)bis(2-methoxy-4-methylphenol) (Compound C1) is shown below.

Example 15

Method for the preparation and analysis of 5,5'-methylenebis(2-methoxy-4-methylphenol) (Compound E1). Compound 1, 5.03 g (36.4 mmol), and 37% formaldehyde, 1.47 g (18.1 mmol), were diluted in 40 mL of $H_2O$. 10 mL of concentrated HCl were slowly added and the reaction was refluxed under $N_2$ for 3 hours. A precipitate formed, the solution was decanted and the solid washed with a 10% EtOH solution. The solid was dissolved in ether and precipitated with heptane. Compound E1, a white crystalline solid, was isolated in 63% yield (3.29 g). Crystals suitable for an X-ray diffraction study were obtained from slow evaporation of ether at room temperature. $^1H$ NMR ($d_6$-DMSO) δ: 2.08 (s, 6H), 3.56 (s, 2H), 3.71 (s, 6H), 6.30 (s, 2H), 6.72 (s, 2H), 8.54 (s, 2H). $^{13}C$ NMR ($d_6$-DMSO) δ: 19.0, 35.0, 56.2, 115.0, 117.0, 126.3, 131.3, 144.8, 146.6. MP: 131-134° C., MS m/z: 288, 273, 257, 241, 227, 213, 195, 181, 165, 150. EA Calcd. (found): C, 70.81 (70.66); H, 6.99 (7.16).

Example 16

Method for the preparation of 6,6'-methylenebis(2-methoxy-4-methylphenol) (Compound F1). 5 g of 2-methoxy-4-methylphenol (Compound 1) (36.2 mmol), 1.56 g of 37% formaldehyde (19.2 mmol) and 70 mg of $Zn(ac)_2.2H_2O$ (3.2× $10^{-4}$ mol) were refluxed overnight under $N_2$. The resulting oil was washed with 10° % EtOH, and extracted with ether. The ether was removed under reduced pressure and the resulting oil was heated to 100° C. overnight under vacuum. The resulting solid was dissolved in ether and precipitated with heptane. The light tan solid was filtered, washed with excess heptane and dried to yield 2.13 g (41%). $^1H$ NMR ($d_6$-DMSO) δ: 2.11 (s, 6H), 3.71 (s, 2H), 3.74 (s, 6H), 6.35 (d, 2H, J=2 Hz), 6.58 (d, 2H, J=2 Hz), 8.20 (s, 2H). $^{13}C$ NMR ($d_6$-DMSO) δ: 21.1, 29.0, 56.2, 110.7, 122.7, 127.4, 127.7, 141.9, 147.5. MP: 123-125° C., MS: m/z: 288, 271, 255, 239, 212, 195, 165, 138, 121, 105. EA Calcd. (found): C, 70.81 (70.84); H, 6.99 (7.13).

Example 17

Method for the preparation and analysis of 5,5'-(propane-1,1-diyl)bis(2-methoxy-4-methylphenol) (Compound G1). Compound 1, 5.1 g (36.4 mmol), and propionaldehyde, 1.04 g (17.9 mmol), were diluted in 10 mL of $H_2O$. 20 mL of 48% aqueous HBr was slowly added and the reaction was stirred at room temperature overnight. The supernatant was carefully decanted from the resultant oil and the product was washed with water. Work up by the standard method described above yielded 3.82 g of viscous tan oil (67%). The product forms a solvent adduct with DMSO that crystallizes from ether solutions upon standing at room temperature. $^1H$ NMR ($d_6$-DMSO) δ: 0.85 (t, 3H, J=7 Hz), 1.73 (t, 2H, J=7 Hz), 2.10 (s, 6H), 3.69 (s, 6H), 3.81 (t, 1H, J=7 Hz), 6.52 (s, 2H), 6.65 (s, 2H), 8.55 (s, 2H). $^{13}C$ NMR ($d_6$-DMSO) δ: 13.1, 18.9, 28.9, 43.3, 56.1, 114.9, 115.0, 126.3, 135.5, 144.5, 145.6. MS m/z: 316, 287, 257, 240, 211, 195, 167, 151, 131, 115. EA Calcd. (found) for 5•1.5H2O: C, 66.45 (66.33); H, 7.92 (7.78). The dibromoperylene comonomers can be synthesized in two steps starting with perylene dianhydride. See for example J. Am. Chem. Soc. 2009, vol. 131, pp. 14267-14273. Scheme 9 shows a procedure for making a dibromoperylene diimide comonomer.

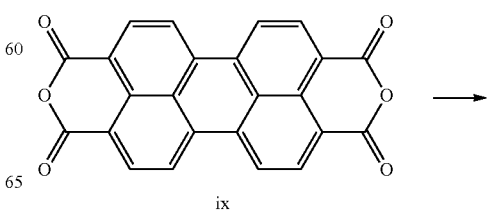

ix

19

-continued

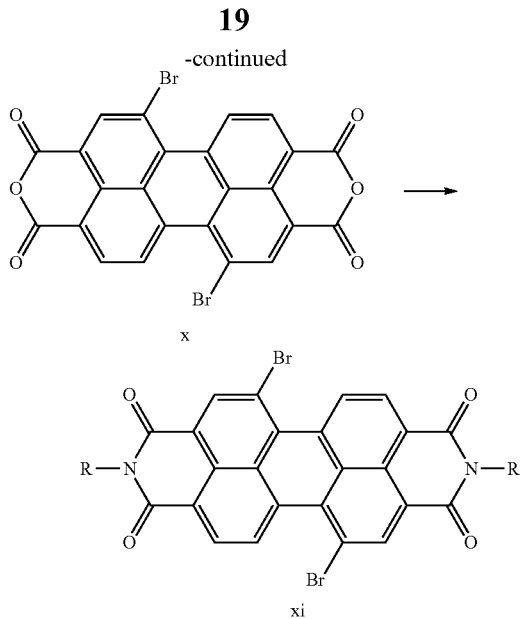

Scheme 9. Preparation of 2,7-dibromoperylene-3,4,9,10-tetracarboxylic acid dianhydride (Compound x) and diimide (Compound xi).

Example 18

Narrative for the preparation of 2,7-dibromoperylene-3,4,9,10-tetracarboxylic acid dianhydride (Compound x) and diimide (Compound xi), Scheme 1. Compound ix (100 g, 254.9 mmol) was added to sulfuric acid (800 mL) and allowed to stir at 60° C. for 2 days. Iodine (3 g, 11.8 mol) was added and stirred for 5 hours and then bromine (200 g, 1.25 mol) was added dropwise. The heat was increased to 80° C. and the reaction was heated for another 2 days. The reaction mixture was allowed to cool to room temperature and poured into ice water (1 L). The red precipitate was collected, dried and used in the next step without further purification.

Example 19

Narrative for the preparation of N,N'-Di(2-ethylhexyl)-1,7-dibromoperylene-3,4,9,10-tetracarboxylic acid diimide (Scheme 9, Compound xi). A flask was charged with 2,7-dibromoperylene-3,4,9,10-tetracarboxylic acid dianhydride (6.13 g, 11.1 mmol) (Compound x), 2-ethylhexylamine (4.5 mL, 30 mmol), 1-methyl-2-pyrrolidinone (50 mL) and acetic acid (3.5 mL). The suspension was heated at 100° C. for 2 days then poured into 1 M HCl (200 mL). The red precipitate was isolated by filtration then washed with water and methanol. The product was purified by column chromatography on silica gel (eluent: 70-80% dichloromethane in hexanes). The red solid was then dissolved in 50 mL of toluene. This solution was exposed to the vapor of hexanes over 14 days, resulting in the crystallization of the product as a red powder.

Example 20

General method for the preparation of copolymers of the invention. The perylene comonomer and the bisphenol comonomer were added in a 1 to 1 stoichiometric ratio and dissolved in DMF. To this solution was added KOH as an aqueous solution and heated for 100° C. for 2 days. The solution was then heated at 120° C. for 6 hours. The solution was poured into water and the precipitate was filtered, washed with water and dried.

20

Novel and superior device components and devices can be made from the copolymers of embodiments of the invention, including in the fabrication of nanoplasmonic films and cavities. Some uses for the copolymers include, but are not limited to, biosensors, solar energy, optical instruments, and fiber optics. The copolymers of embodiments of the invention have several advantages over prior art, including guest-host copolymer systems in which a dye (a guest), including perylene, is dissolved or dispersed within a copolymer host material. Guest-host systems have the disadvantages of instability due to dye aggregation and toxicity due to the dye being easily removed from the surface by touch and then absorption into the body. In contrast, the perylene unit in the copolymers of embodiments of the invention is covalently attached to copolymer and thus is inhibited from aggregation and removal. Furthermore, the material of the invention has advantages of high thermal stability (to 300° Celsius) and photo-chemical stability. The material of embodiments of the invention is solution processable at ambient conditions with safe and common solvents. Importantly, the material may be processed into films having a thickness less than about 100 an with very low roughness (less than about 1 nm), presenting a high optical quality surface upon which to deposit subsequent layers, for example, to form a stack of layers creating a nanoplasmonic coating.

Example 21

Copolymer PB2 of the invention was used to demonstrate the fabrication of useful and novel films and devices. Copolymer PB2 is very thermally stable. By Thermal Gravimeteric Analysis (TGA) measurement PB2 has only a slight weight loss at 300° C. (probably residual solvent). Significant weight loss does not occur until the temperature reaches about 400° C. The glass transition temperature is in the range of 150° C. to 160° C. The PB2 copolymer is thermoplastic and is thus easily moldable into a variety of shapes; for example disks or rods.

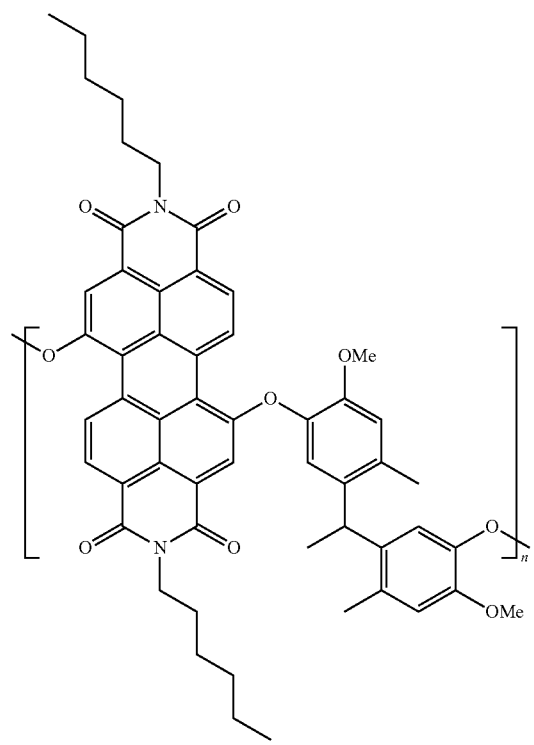

The chemical structure of PB2, an example of a soluble perylene copolymer of embodiments of the invention.

Films made of PB2 were surprisingly flat (planar) as measured by Atomic Force microscopy (AFM), as shown below. Films of PB2 can be consistently produced having peak to valley variations in the sub-nanometer range (typical peak-to-valley roughness ranging between 0.2 and 0.8 nanometers). This degree of roughness is ideal for laser media, laser mirrors, and many other applications. In this regard copolymers of embodiments of the invention have a major advantage over prior art. Thin films of these copolymers are conformal on surfaces with rather large features (e.g., >100 nm), and planarizing on surfaces having nanoscopic features (e.g., <1 nm).

Example 22

A useful application for copolymer PB2 is in applications requiring water resistance. Copolymer PB2 has water-resistant properties similar to saccate pollen grains, which are known for their exceptionally high water resistance. After a week exposure to water in a soxhlet extractor with constant contact with hot (greater than 80° C.) water, copolymer PB2 remained a dry powder.

The following prophetic examples are for illustration purposes only and not to be used to limit any of the embodiments.

Example 23

A leaky-mode nanoplasmonic cavity can be fabricated with the copolymers of the invention. An example of prior art on fabricating a nanoplasmonic cavity is given in Applied Physics Letters, vol. 84, no. 2231, May 2004, pp. 4421-4423. For the perylene diimide chromophore in PB2, the luminescent peak emission of PB2 occurs at 602 nm (wavelengths of peak excitation are 429 nm and 454 nm). Therefore, such a plasmonic cavity having the thickness of the top metal, copolymer PB2, and substrate layer is constructed that has a very low reflection at the excitation wavelengths of 429 nm or 454 nm. Thus, the excitation light from the perylene units can be trapped within the cavity and be fully absorbed by the copolymer. The multilayer stack is designed to be highly reflective at the both excitation and emission wavelengths. Therefore, the emitted fluorescence light can propagate inside the cavity. The copolymers of the invention are useful in other devices requiring such nanoplasmonic cavities.

Example 24

A useful application for films of the copolymers of embodiments of the invention is in distributed feedback lasers and/or tunable Fabry-Perot lasers in which ultra-smooth surfaces are required to minimize the amount of incident light that is scattered. The ultra-smooth surface of PB2 suggests that the perylene copolymers of embodiments of the invention are amorphous and/or have a low concentration of dye aggregates. Thus the perylene copolymers of embodiments of the invention enable compact and efficient optically pumped lasers. An example of prior art on fabricating a distributed feedback laser utilizing an organic solid-state thin film that can be excited by optical-pumping is D. Schneider, T. Rabe, T. Reidl, T. Dobbertin, M. Kroger, E. Becker, H. Johannes, W. Kowalsky, T. Weimann, J. Wang, P. Hinze, A. Gerhard, P. Stossel, H. Vestweber, "An Ultraviolet Organic Thin-Film Solid-State Laser for Biomarker Applications", Advanced Materials, vol. 17, no. 1, 6 Jan. 2005, pp. 31-34.

Example 25

A useful application for the copolymers of embodiments of the invention is in low cost flat mirrors for laser applications that obviate the need for costly mechanical polishing. The primary property for mirrors for laser applications is the roughness. Ultra-smooth surfaces (less than one- to five-nanometer roughness) are desired so the least amount of incident light is scattered. To make these smooth surfaces typically requires mechanical polishing, which is costly, both in terms of time and funding. A benefit as compared to mechanical processing/polishing is that the films of embodiments of the invention are produced through solution casting, which allows for scale up to large surface areas, including greater than one square foot in area.

Example 26

A useful application for the n-type soluble copolymers of the invention is in heterojunction materials. A blend/mixture (or a block copolymer) of an n-type material and a p-type material is an electronic or photonic 'heterojunction' material. n-type organic materials generally have electron-withdrawing groups/components, such as carbonyl and sp2 nitrogen, including azo, aromatic pyridinyl and fluorocarbon. p-Type organic material generally have electron-donating groups/components, including alkoxy, amine, thiophene units. Generally, crystalline n-type and p-type copolymers are more useful in photovoltaic devices, and amorphous n-type and p-type copolymers are more useful in light emitting devices. Heterojunction copolymers are useful in devices including photovoltaic devices; organic solar cells; field-effect transistors, plastic solar cells; RFID tags; and electronic sensors.

Example 27

A useful property of copolymer PB2, because it is readily soluble in common organic solvents including THF, chloroform and chlorobenzene, and because it forms very flat films, is that it may not require post deposition processing/treatment, including thermal curing.

Embodiments of the invention generally relate to n-type copolymers including, a soluble n-type perylene copolymer having base formula A2:

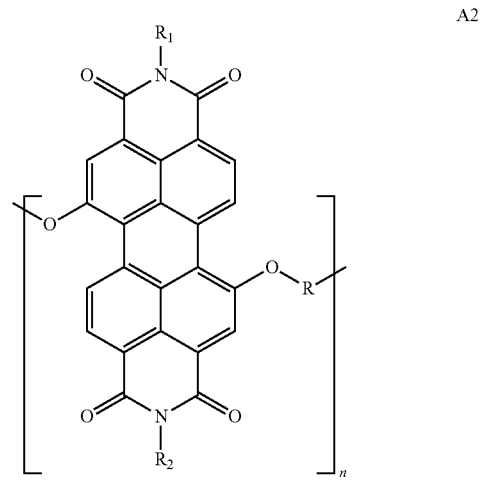

where R is a backbone segment, where $R_1$ and $R_2$ are independently selected from the group consisting of alkyl, fluorinated alkyl, functionalized alkyl, aryl, fluorinated aryl, and functionalized aryl, and where n ranges from about 2 to 50,000.

Another embodiment of the invention generally relates to film(s) having n-type copolymer including, a conformal film having soluble n-type perylene copolymer having base formula H:

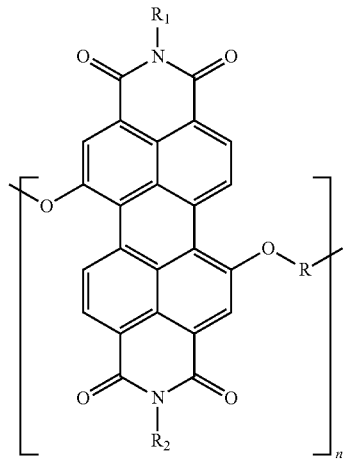

H where R is a backbone segment, where $R_1$ and $R_2$ are independently selected from the group consisting of alkyl, fluorinated alkyl, functionalized alkyl, aryl, fluorinated aryl, and functionalized aryl, and where n ranges from about 2 to about 50,000.

In embodiments, $R_1$ and $R_2$ are independently selected from the group consisting of 2-ethylhexyl, 4-carbon to 30-carbon alkyl, 6-carbon to 30-carbon cycloalkyl, fluorinated group(s), and perfluorinated group(s). In embodiments, R includes B:

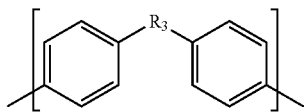

B where $R_3$ is selected from the group consisting of methylene, ethylene, propylene, isopropylene, trimethylcyclohexylene, hexafluoroisopropylene, ether, amine, carbazole, sulfide, sulfone, phosphine, phosphine oxide, and phosphinate.

In embodiments, R includes C2:

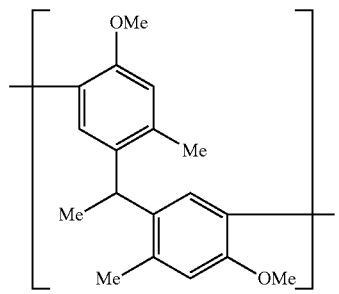

C2

In embodiments, R includes D2:

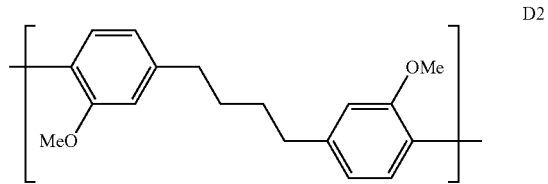

D2

In embodiments, R includes E2:

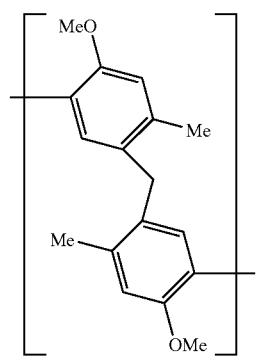

E2

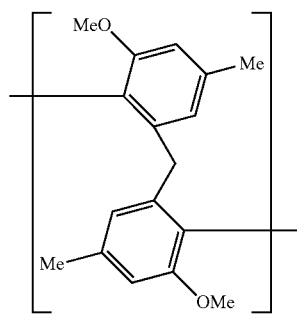

F2

In embodiments, R includes F2:
In embodiments, R includes G2:

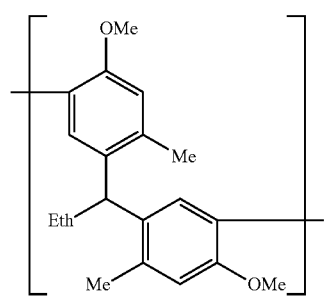

G2

In embodiments, R includes biphenylene. In other embodiments, R includes triphenylene. In embodiments, the copolymer forms at least one hydrophobic coating having water resistance approximately equivalent to saccate pollen grains. In embodiments, the copolymer forms at least one conformal layer. In other embodiments, the copolymer forms at least one coplanarizing layer. In embodiments, the copolymer is combined with a p-type polymer to form a heterojunction material. In embodiments, the heterojunction material is associated in a heterojunction device. In embodiments, the copolymer forms at least one film having thickness ranging from about 5 nm to about 10,000 nm and having peak-to-valley surface roughness less than about 0.9 nanometers over a surface area of 0.5×0.5 microns as measured by atomic force microscopy. In other embodiments, the copolymer forms at least one nano-layer film having thickness ranging from about 10 nm to about 150 nm and having peak-to-valley surface roughness less than about 0.9 nanometers over a surface area of 0.5×0.5 microns as measured by atomic force microscopy.

In embodiments, the film(s) can be associate with, but not limited to, plasmonic devices, Fabry-Perot lasers, distributed feedback lasers, and mirrors. In embodiments, n can range from about 5 to about 50,000. In other embodiments, n can range from about 10 to about 50,000.

A transistor is an electronic valve or switch in which the current flow in a channel between a source electrode and a drain electrode is controlled by the magnitude of an electric field (also called the 'bias') applied at a gate electrode. The gate electrode controls the electrical conductivity of a channel of a nearby charge carrier material (the 'semiconductor') but is not in electrical contact with the semiconductor channel. Mechanical flexibility is a key advantage of the organic TFT devices embodied in the invention over conventional inorganic TFT devices.

An embodiment of the invention employs an n-type organic copolymer as the charge carrier material, in which the charge flow is dominated by electrons (negative charges). The organic TFT embodiment of the invention affords added flexibility, ease of integration in the end-use device, and reduced cost. Examples of useful applications for TFTs are display backplanes, integrated circuits for lighting, sensors, radio-frequency identification (RFID) tags, and any application where logic circuitry is required. The solution-processable n-type charge carrier materials of the invention can also be used in CMOS circuits that afford flexible designs, low production costs, and energy efficiency.

An application of organic TFTs is in liquid crystal displays (LCD)s. LCDs are used, for example, in color TV displays and computer monitors. TFTs are embedded within the display panel itself, reducing crosstalk between pixels and improving image stability. Transparent TFTs are required for the construction of video display panels. By using transparent charge carrier materials, such as the transparent n-type perylene copolymers of the invention, and transparent electrodes, such as indium tin oxide (ITO), TFTs can be made transparent.

TFT fabrication processes based on printing have a number of advantages over conventional photolithography. Printable processes can dramatically reduce material waste and manufacturing process steps while lowering manufacturing costs. Moreover, they can be readily scaled to large-area production with high throughput. These features enable low-cost, large-area, and flexible device applications.

As an embodiment of the invention, an n-type organic charge carrier material is a semiconductor material in a TFT device. The solution-processable n-type carrier material makes possible the fabrication of TFTs by printing methods, such as ink-jet, aerosol-jet, screen, flexo, and gravure.

FIG. 1 (Prior Art of TFT designs—Polera) show four cross-section geometries that are used in the fabrication of TFTs; from left to right: the Top-Gate/Top-Contact (TG/TC) geometry; the Top-Gate/Bottom-Contact (TG/BC) geometry; the Bottom-Gate/Bottom-Contact (BG/BC) geometry, and the Bottom-Gate/lop-Contact (BG/TC) geometry where the lower white layer is the substrate. The TFT structures are not limited to FIG. 1, anyone skilled in the art would appreciate different uses and different configurations.

The TG/BC and BG/BC geometries offer a large surface area for charge injection from the source into the charge carrier material. The BG/BC geometry may be easier to produce, because the charge carrier material is the final layer to be deposited, and therefore, it is not exposed to potentially damaging chemicals used to process other layers.

Embodiment of the invention generally relates to organic TFT devices having the following materials: at least one substrate, at least one organic semiconductor material that is an n-type charge carrier material (an electron-transporting material), at least one dielectric material (electrically insulating), and electrically-conducting metals and/or other semiconducting materials that form electrical contacts (the electrodes). An embodiment of the invention is the use of plastic and elastomeric substrates for mechanically flexible and stretchable constructs.

A method to form an organic solution-processable TFT using the BG/TC geometry starts by taking a substrate which can be silicon, germanium, alumina, gallium arsenide, quartz, silica glass, silicon-nitrogen oxide, other inorganic glasses, plastics including polyethylenes and polyimides, and elastomerics including polydimethylsiloxanes; depositing onto the substrate a gate electrode being a conductive metal including Au, Ag, and Al, and/or a metal oxide including ITO, and or a conductive polymer including doped polythiophene; followed by the deposition of an electrical insulator including silicon dioxide, alumina oxide, silicon-nitrogen oxides, hafnium oxide, a polymer including epoxies, benzocyclobutene-based polymers (BCBs) and polyimides to form the dielectric layer (that lies between the gate and the organic semiconductor material). In this embodiment the organic semiconductor material is a solution-processable n-type polymer. The semiconductor layer, an enabling feature of the invention, may be formed by spin-casting. Examples of the n-type copolymer are the xiv perylene ladder polymer and the PB2 copolymer. Deposition of thin metal films, metal oxide films, and/or conductive polymer films to form the source and drain electrodes (in electrical contact with the semiconductor layer) completes the device fabrication. The electrically-conductive electrodes can be ink-jet printed, for example, using silver nanoparticle inks that form silver electrodes.

Embodiments of the invention generally relate to thin-film transistor (TFT) device(s) including, an organic TFT device having at least one substrate, at least one gate electrode, at least one electrically-insulating dielectric material, at least one drain electrode, at least one source electrode, and at least one n-type solution-processable semiconductor material. Another aspect of the invention generally relates to thin-film(s) or layer(s) of semiconductor material(s) including at least one organic film or layer having at least one substrate, at least one gate electrode, at least one electrically-insulating dielectric material, at least one drain electrode, at least one source electrode, and at least one n-type solution-processable semiconductor material.

In embodiments, the dielectric material(s) is associated between the gate electrode(s) and the semiconductor material(s) and where at least one source electrode and at least one drain electrode are electrically associated with the semiconducting material(s). In embodiments, the gate electrode(s) is associated between the substrate(s) and the dielectric material(s) and where the organic semiconducting material(s) is associated with the dielectric material(s) and is electrically associated with at least one source electrode and at least one drain electrode. In embodiments, the substrate(s) is selected from at least one of the group consisting of silicon, germanium, alumina, gallium arsenide, quartz, silica glass, silicon-nitrogen oxide, other inorganic glasses, plastics including polyethylenes and polyimides, elastomerics including polydimethylsiloxanes, and any combination thereof.

In embodiments, at least one gate, drain, and/or source electrode is printed electrically-conductive material selected from the group consisting of Au, Ag, Al, metal alloys thereof, indium oxide, indium tin oxide (ITO), zinc indium tin oxide, other metal oxides, conductive polymers, and any combination thereof. In other embodiments, at least one gate, drain, and/or source electrode is ink-jet printed with electrically-conductive material selected from the group consisting of Au, Ag, Al, metal alloys thereof, indium oxide, indium tin oxide (ITO), zinc indium tin oxide, other metal oxides, conductive polymers, and any combination thereof. In embodiments, the dielectric material is selected from the group consisting of silicon dioxide, hafnium oxide, silicon-nitrogen oxide, and electrically insulating polymers including epoxies, benzocyclobutene-based polymers, polyimides, and any combination thereof. In embodiments, the semiconductor material is an n-type perylene copolymer and is soluble in common non-corrosive solvents. In other embodiments, the semiconductor material is an n-type ladder copolymer formed with alternating perylene and pyridine units and is soluble in common non-corrosive solvents. Yet in other embodiments, the semiconductor material is copolymer PB2.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

What is claimed is:
1. A thin-film transistor (TFT) device, comprising:
   at least one n-type solution-processable semiconductor material, wherein said semiconductor material is copolymer PB2 (A)

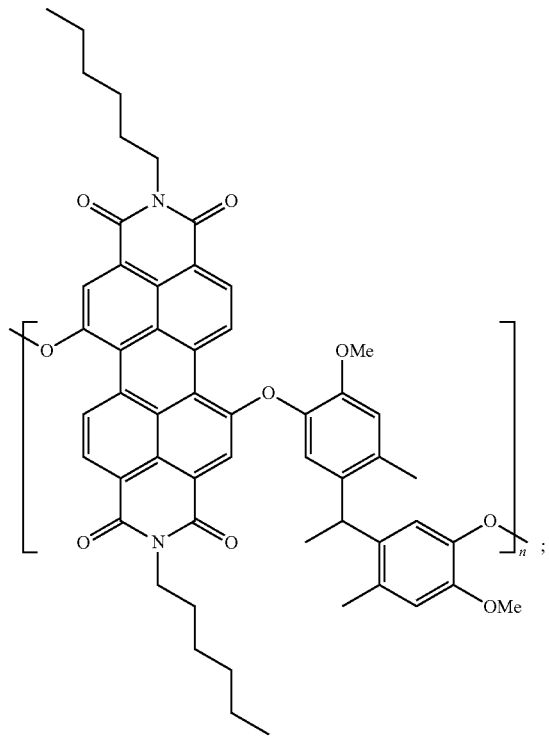

(A)

at least one substrate;
   at least one gate electrode;
   at least one electrically-insulating dielectric material;
   at least one drain electrode; and
   at least one source electrode.

2. The device according to claim 1, wherein said dielectric material is associated between said gate electrode(s) and said semiconductor material(s) and wherein at least one said source electrode and at least one said drain electrode are electrically associated with said semiconducting material(s).

3. The device according to claim 1, wherein said gate electrode(s) is associated between said substrate(s) and said dielectric material(s) and wherein said organic semiconducting material(s) is associated with said dielectric material(s) and is electrically associated with at least one said source electrode and at least one said drain electrode.

4. The device according to claim 1, wherein said substrate(s) is selected from at least one of the group consisting of silicon, germanium, alumina, gallium arsenide, quartz, silica glass, silicon-nitrogen oxide, other inorganic glasses, plastics including polyethylenes and polyimides, elastomerics including polydimethylsiloxanes, and any combination thereof.

5. The device according to claim 1, wherein at least one said gate, drain, and/or source electrode is printed electrically-conductive material selected from the group consisting of Au, Ag, Al, metal alloys thereof, indium oxide, indium tin oxide (ITO), zinc indium tin oxide, other metal oxides, conductive polymers, and any combination thereof.

6. The device according to claim 1, wherein at least one said gate, drain, and/or source electrode is ink-jet printed with electrically-conductive material selected from the group consisting of Au, Ag, Al, metal alloys thereof, indium oxide, indium tin oxide (ITO), zinc indium tin oxide, other metal oxides, conductive polymers, and any combination thereof.

7. The device according to claim 1, wherein said dielectric material is selected from the group consisting of silicon dioxide, hafnium oxide, silicon-nitrogen oxide, and electrically insulating polymers including epoxies, benzocyclobutene-based polymers, polyimides, and any combination thereof.

8. The device according to claim 1, wherein said semiconductor material is an n-type perylene copolymer and is soluble in common non-corrosive solvents.

9. The device according to claim 1, wherein said semiconductor material is an n-type ladder copolymer formed with alternating perylene and pyridine units and is soluble in common non-corrosive solvents.

10. A thin-film or layer of semiconductor material(s), comprising:

at least one n-type solution-processable semiconductor material, wherein said semiconductor material is copolymer PB2 (A)

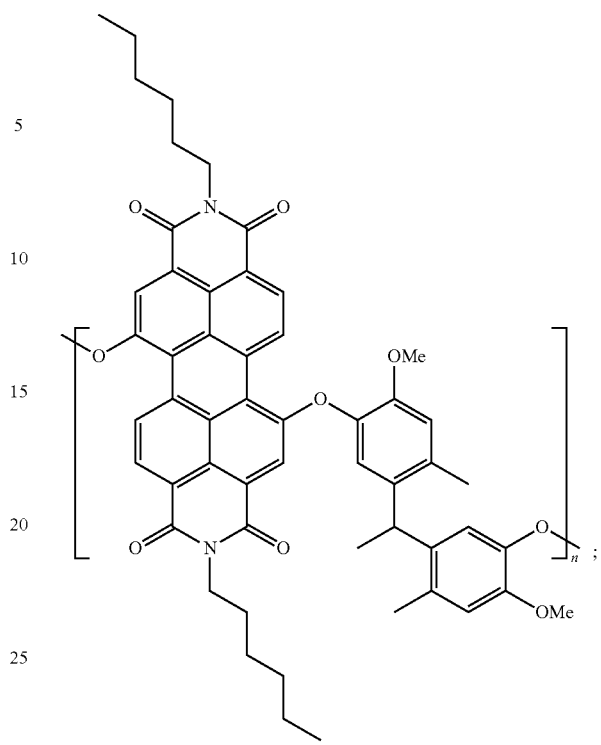

at least one substrate;
at least one gate electrode;
at least one electrically-insulating dielectric material;
at least one drain electrode; and
at least one source electrode.

* * * * *